United States Patent [19]

Nielsen

[11] Patent Number: 4,799,220
[45] Date of Patent: Jan. 17, 1989

[54] DYNAMIC SYSTEM FOR TESTING AN EQUIPMENT

[75] Inventor: Robert E. Nielsen, Farmingville, N.Y.

[73] Assignee: Grumman Aerospace Corporation, Bethpage, N.Y.

[21] Appl. No.: 16,685

[22] Filed: Feb. 19, 1987

[51] Int. Cl.$^4$ .............................................. G06F 11/06
[52] U.S. Cl. ......................................... 371/25; 371/18
[58] Field of Search ................... 371/25, 18, 29, 16, 371/15, 22; 324/73 R, 73 AT, 73 PC

[56] References Cited

U.S. PATENT DOCUMENTS

| | | | |
|---|---|---|---|
| 4,315,311 | 2/1982 | Cousse | 371/18 |
| 4,502,127 | 2/1985 | Garcia et al. | 364/900 |
| 4,503,536 | 3/1985 | Panzer | 371/25 |
| 4,510,572 | 4/1985 | Reece | 371/25 |
| 4,523,312 | 6/1985 | Takeuchi | 371/25 |
| 4,581,738 | 4/1986 | Miller | 371/18 |
| 4,696,004 | 9/1987 | Nakajima | 371/25 |
| 4,710,932 | 12/1987 | Hiroshi | 371/25 |
| 4,715,035 | 12/1987 | Boelner | 371/25 |

Primary Examiner—Michael R. Fleming
Attorney, Agent, or Firm—Pollock, VandeSande & Priddy

[57] ABSTRACT

An automatic testing instrument determines the operational status of an equipment under test on a real time basis by first generating from a stimulus memory a pattern for stimulating the equipment which, when stimulated by the pattern, sends out a response pattern, which is transmitted back to the automatic testing instrument. The testing instrument then takes the received response pattern and compares it with a pre-determined pattern stored in a comparator. If the response pattern differs from the expected pattern, an error signal is sent to indicate to the user of the testing instrument that the equipment under test is operating erroneously, for that particular pattern.

11 Claims, 3 Drawing Sheets

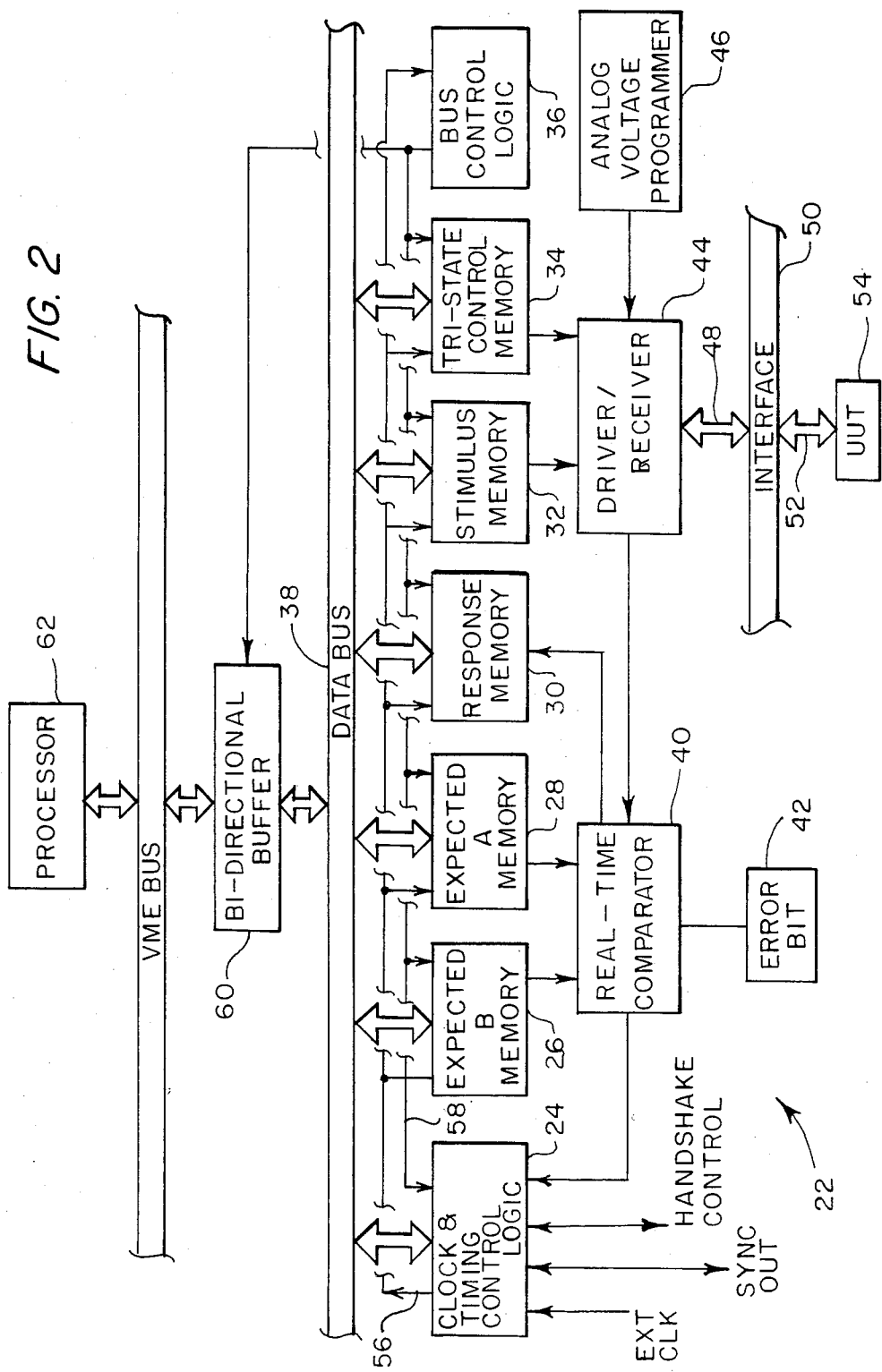

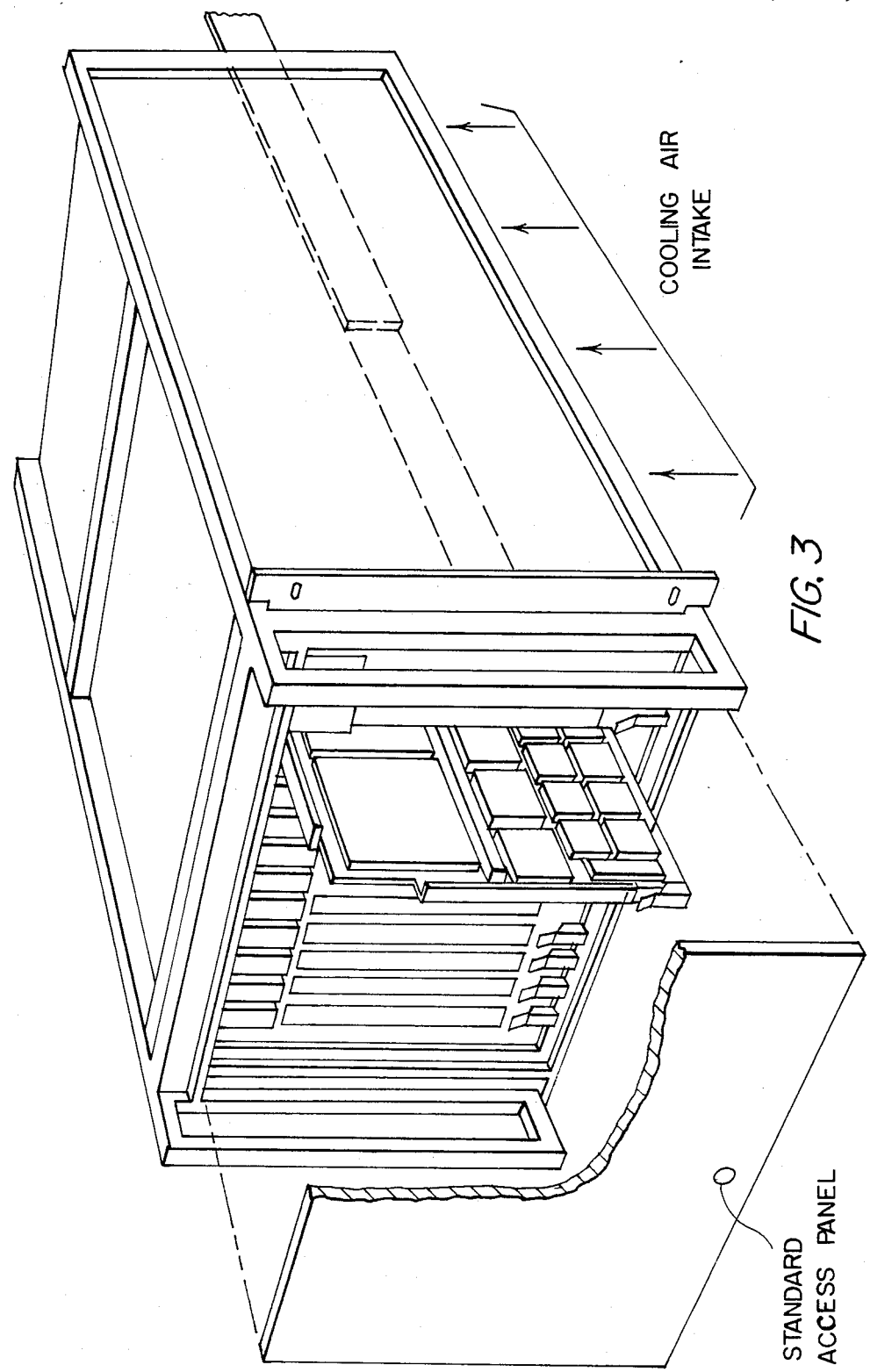

DYNAMIC SYSTEM FOR TESTING AN EQUIPMENT

FIELD OF THE INVENTION

The present invention relates to an automatic testing instrument, and more particularly to a digital testing instrument capable of generating digital data patterns for stimulating an equipment under test and of receiving from the same equipment digital response patterns for determining the operational status of the equipment.

BACKGROUND OF THE INVENTION

Where an equipment is to be tested, often times stimuli need to be fed into the equipment in order to educe therefrom a response, which is compared with an expected result for determining the operational status of the equipment. The inventor of the instant application had previously discussed in an article entitled "High-Speed Digital Test Capability for Emerging Technology" the concept of a dynamic digital test assembly (DTA), which functional block diagram is shown in FIG. 1 of the article. There, the response signals obtained from an equipment are first fed to a response memory. And if so desired, the response signals are then sent to a comparator, which compares the response signals with some expected signals for determining the operational status of the equipment. As shown, the response memory is linked to the comparator by means of a dotted line, thereby signifying that this comparison operation is optional. Upon further evaluation and research, it was found that since the DTA needs to store the response signals in before being able to withdraw the same from the response memory in order to compare these signals with some expected signals, it cannot operate on a real-time basis. Thus, to increase the speed at which the testing instrument can operate, a new configuration is needed.

SUMMARY OF THE INVENTION

The instrument of the present invention provides for a digital pattern generator, otherwise known as a digital word generator (DWG), which can generate from a first memory stimulus patterns which are fed to an equipment under test for eliciting response patterns therefrom. The response patterns from the equipment under test are received by the same instrument and directed to a comparator, which compares these response patterns with expected patterns fed from a second memory. The results of the comparisons are then stored in a response memory. And if there are differences between the response patterns and the expected patterns, an error-indicator, representative of incorrect equipment operation, is activated. At this point, the system can either stop or continue to run, depending on the choice of the operator. If it is desired that the testing of the equipment proceeds until all testing operations are finished, the operator, by noting that there is an error indication, can—upon completion of the testing operations—retrieve from the response memory the specific testing operation that caused the error indication.

Since the DWG is a digital instrument and since the comparison is being done on a real time basis, the DWG is capable of testing an equipment at a higher speed than previous systems. Also, the DWG can perform pattern by pattern analysis, thereby providing for a step-by-step operational analysis of the equipment under test.

It is, therefore, an objective of the present invention to provide for an automatic test instrument which can compare in real time signals obtained from an equipment under test with signals deemed to be correct to determine the operational status of the equipment.

It is another objective of the present invention to provide for an automatic testing equipment which has the capability to compare on a pattern by pattern basis the response and expected patterns of an equipment.

It is yet a further objective of the present invention to provide for a detailed real time record of what occurred during the testing of an equipment.

The above-mentioned objectives and advantages of the present invention will become more apparent and the invention itself will be best understood by reference to the following description of an embodiment of the invention taken in conjunction with the accompanying drawings, wherein:

BRIEF DESCRIPTION OF THE DRAWING

FIG. 2 is a block diagram of one preferred embodiment of the present invention; and FIG. 3 is a perspective view of an automatic testing instrument which includes a plurality of cards, each containing the memories and modules shown in the block diagram of FIG. 2.

DESCRIPTION OF THE PREFERRED EMBODIMENT

Figure 1:
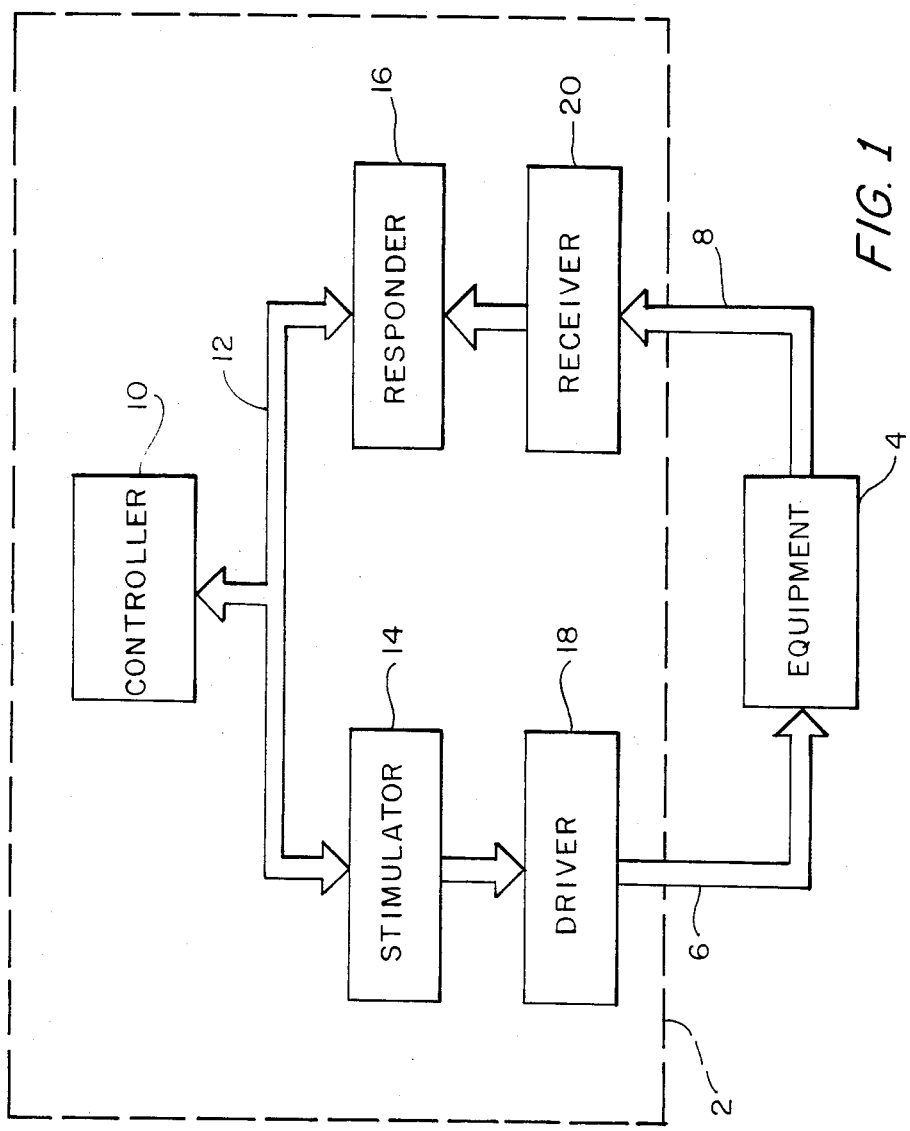
FIG. 1 is a simplified block diagram of the automatic testing equipment of the present invention.

A simplified block diagram of the present invention instrument is shown in FIG. 1, which is also shown in co-pending application Ser. No. 906,057, by the inventor of the instant application and assigned to the same assignee of the present application. As was discussed in the co-pending application, a number of equipment may be connected via driver line 6 and receiver line 8 to automatic testing instrument 2. Stimulator 14 is used to store generated test patterns, which are fed to driver 18 and inputted to equipment 4 by means of driver line 6. In response to the test patterns, equipment 4 generates response patterns, which are fed by means of line 8 to receiver 20, and subsequently fed to responder 16. To keep FIG. 1 simple, no comparator is shown. The operations of stimulator 14 and responder 16, of course, are controlled by controller 10 in this simplified block diagram. Thus, it can be seen that automatic testing instrument 2 both generates patterns for stimulating an equipment under test and receives subsequent patterns from the same equipment in response to the stimulus patterns for determining the operational status of the equipment.

As was disclosed in the aforesaid co-pending application, driver 18 is described in a co-pending application Ser. No. 059,075 or 059,073 by John M. Weick and assigned to the same assignee of the present application. Further, receiver 20 is described in a co-pending application Ser. No. 024,486 by Joseph Langone and Michael Ugenti, again assigned to the same assignee. It should also be noted that stimulator 14 and responder 16 are respectively described in co-pending applications Ser. Nos. 906,057 and 914,440 by the inventor of the instant application, and assigned to the same assignee.

Referring to FIG. 2, there is shown a more detailed block diagram of the FIG. 1 automatic testing instrument, henceforth to be referred to as Digital Word Generator (DWG). As shown, DWG 22 includes a clock and timing control logic 24, an expected B memory 26, an expected A memory 28, a response memory 30, a stimulus memory 32, a tri-state control memory 34 and a bus control logic 36. But for bus control logic 36, all of the above cited components are connected to a data bus 38, which is used for isolation purposes. Also included in DWG 22 are a real-time comparator 40 and an error bit indicator 42 connected thereto, a driver/receiver 44 and an analog voltage programmer 46.

Driver/receiver 44 is connected via a bi-directional line 48 to an interface 50, which also has connected thereto by means of bi-directional line 52 an equipment under test 54, also referred to as an unit under test (UUT). Although one equipment is shown, it should be appreciated that a plurality of equipment, as well as a corresponding number of the same FIG. 2 configuration, may, in reality, be connected to interface 50.

Focus now on driver/receiver 44. It can be seen that it has as inputs an output from stimulus memory 32, an output from tri-state control 34 and an output from analog voltage programmer 46—not to mention the input of signals from equipment 54 by means of bi-directional line 48. The output of driver/receiver 44 is fed to real-time comparator 40, which also has as its inputs the outputs from expected B memory 26 and expected A memory 28. For the sake of simplicity, error bit indicator 42 is shown to be connected to real-time comparator 40—this in spite of the fact that the error bit indicator may actually be incorporated within real-time comparator 40. An output of real-time comparator 40 is fed to response memory 30 while a second output of the same is fed to clock and timing control logic 24.

By means of lines 56 and 58, clock and timing control logic 24 provides for the timing control of expected B memory 26, expected A memory 28, response memory 30, stimulus memory 32, tri-state control memory 34 and bus control logic 36. The timing for clock and timing control logic 24 may be internally or externally provided. In the case of an internal clock pulse, a frequency, for example 100 MHz, is used. In the event that a specific frequency is required, the user can provide external clock pulses by means of the Ext Clk line. The Sync Out line is used for synchronizing a different apparatus, for example a different testing instrument, when it is desirable to synchronize the second testing instrument with the DWG. The Handshake Control line is used to synchronize two otherwise asynchronous actions to assure that the DWG will never get ahead of the equipment under test and vice versa, i.e., each device will hold the other up until each is ready to be connected.

As discussed previously, each of the clock and timing control logic 24, expected B memory 26, expected A memory 28, response memory 30, stimulus memory 32 and tri-state control memory 34 is respectively connected to data bus 38. Also connected to data bus 38 by means of a bi-directional line is bi-directional buffer 60, which in turn has as one of its inputs an output from bus control logic 36. Bi-directional buffer 60 is connected to a VME bus, which is made by Motorola and which has connected thereto processor 62, the processor supplying instructions to the different components of DWG. Data bus 38 is added to make sure that the VME bus is not overloaded.

Returning now to the individual components, it should be noted that expected B memory 26, expected A memory 28, stimulus memory 32 and tri-state control memory 34 all have structures similar to that described by the inventor of the instant application in co-pending application Ser. No. 906,057. The structure for bus control logic 36 is also described in the just noted co-pending application. As for response memory 30, it should be noted that the detailed description of this element is described by the inventor of the instant application in the co-pending application Ser. No. 914,440. As was mentioned previously, the respective driver and receiver portions of driver/receiver 44 are described by John M. Weick and Michael Ugenti in corresponding co-pending applications Ser. Nos. 059,075 or 059,073 and 948,260, both assigned to the same assignee of the present application.

Analog voltage programmer 46 is conventional. It operates in the same fashion as a Schmitt trigger. In other words, analog voltage programmer 46 provides the DWG user the ability to program the logic levels of the DWG within a certain range, i.e., from minus 10 to plus 10 volts. Real-time comparator 40 is a conventional hardware comparator which compares on a real-time basis each bit of whatever number of bits in a pattern with corresponding bits of predetermined patterns. Hence, for the FIG. 2 embodiment, the comparator may very well be a 16 bit comparator. Error bit indicator 42 is but a conventional indicating device which, for instance, may be a LED meter. Bi-directional buffer 60 is of conventional design and a microprocessor in the Motorola family is used for processor 62. Both bus control logic 36 and clock and timing control logic 24 are conventional circuits. Interface 50 is a mechanical/electrical connection to the UUT.

Expected A memory 28 and expected B memory 26 are programmed with patterns of what the DWG user expects the response patterns from equipment 54 to be, when equipment 54 is stimulated by stimulus patterns from stimulus memory 32. The reason that two memories are used for the expected memory is that there are greater than two possibilities for each bit of a pattern, which has a plurality of data bits. For example, there might be a logic "1", a logic "0", "don't care" condition where comparator 40 is programmed to ignore the state of the bit and a "tri-state" condition wherein the comparator is programmed to respond only to particular states of the bits.

In operation, after the expected memories are programmed with the appropriate expected response patterns, stimulus memory 32 is programmed with a set of stimulus patterns that the DWG user wants to input into equipment 54 for eliciting therefrom a certain set of responses. The test begins with stimulus patterns being fed from stimulus memory 32 to the driver portion of driver/receiver 44. The stimulus patterns are fed by driver/receiver 44 to equipment 54. For this example, each of the stimulus patterns is deemed to contain 16 bits of information. Likewise, each of the response patterns in the expected memories is deemed to have 16 bits of information.

Suppose only one pattern is sent to equipment 54. Upon receipt thereof, equipment 54 is stimulated thereby and sends back a response—which for this example, is deemed to have 16 bits of information and is termed a response pattern—via bi-directional lines 52, 48 and interface 50 to driver/receiver 44. The receiver portion of driver/receiver 44, upon receipt of the response pattern, forwards the same to comparator 40. Prior to the receipt of the response pattern, an expected pattern, again having 16 bits, is sent to and pre-stored in comparator 40. The expected pattern is then compared with the response pattern to determine on a real time basis whether the response pattern received is in fact what is expected. The result of this comparison is fed to response memory 30 and stored therein. Per chance the result indicates the response pattern as not corresponding to the expected pattern, an error signal is sent to error bit indicator 42 to notify the DWG user that the equipment is not operating as expected, for that particular stimulus. At this point, two options are available to the DWG user. Firstly, the user may program the DWG to stop at this point; alternatively, the user may program the DWG to proceed with the testing until all of the stimulus patterns, or a portion thereof, in stimulus memory 32 have been fed to equipment 44 and responses of these stimuli have been compared with corresponding expected patterns, with the results thereof having been stored in response memory 30.

Assuming the DWG user chose the second option. After all of the stipulated stimulus patterns have been sent and compared, if error bit indicator 42 has been activated the user needs only to interrogate response memory 30 to find out in which pattern or in which set of patterns the error(s) occurred. Thus, by means of the DWG, not only can a user ascertain on a real time basis the operational status of an equipment under test, but he can also wait, if he so wants, until all the stimulus patterns have been sent and compared, before evaluating the operational status of the equipment—were it paramount for the equipment under test to be stimulated with a pre-determined set of patterns If there is in fact an error, the precise operational step of the equipment wherein this error occurred can easily be traced, by means of the stimulus pattern which instigated this error.

Tri-state control memory 34 is used to make sure that bi-directional lines 48 and 52 would separately send out stimulus patterns from driver/receiver 44 or receive response patterns from equipment 54. Since tri-state control memory 34 is described in detail by Ugenti and Caiola in co-pending application Ser. No 945,636, only necessary at this time to describe broadly as to now tri-state control memory 34 controls the operation of driver/receiver 44. In essence, tri-state control memory 34 enables the user to declare that bi-directional line 48 can be either a driver or receiver line on a pattern by pattern basis during any test. Putting it differently, tri-state control memory 34 can direct driver/receiver 44 to send out a stimulus pattern of 16 bits at a first clock pulse and to receive the response pattern sent back from equipment 54 at a different clock pulse.

As was mentioned previously, analog voltage programmer 46 is used to set reference levels in the receiver portion of driver/receiver 44 such that the receiver would not respond to any transient inputs.

FIG. 3 shows, in perspective, a DWG which has one of its 16 cards partly withdrawn. It should be noted that on this withdrawn card are the components discussed hereinabove, with regard to FIG. 2.

Inasmuch as the present invention is subject to many variations, modifications, and changes in detail, it is intended that all matters described throughout this specification and shown in the accompanying drawings be interpreted as illustrative and not in a limiting sense. Accordingly, it is intended that the invention be limited only by this spirit and scope Of the appended claims.

I claim:

1. In an instrument for testing the operational status of an equipment under test, an apparatus for stimulating the equipment and for receiving responses therefrom, the apparatus being connected to a controller for receiving instructions therefrom, the apparatus comprising:

stimulating means electrically connected to the controller for accepting therefrom instructions representative of stimulus signals;

means connected to the stimulating means and the equipment for fetching the stimulus signals and for providing the stimulus signals to the equipment, respectively;

means connected to the equipment for receiving from the equipment signals generated thereby in response to the stimulus signals;

means connected to the receiving means for comparing in real time the response signals inputted thereto from the receiving means with expected signals fed thereto from an expected memory means; wherein, if a response signal differs from an expected signal, the comparing means sends out an error signal for instantaneously indicating an improper operation by the equipment; and means connected to the comparing means for storing data resulting from the real time comparison between the response signals and the expected signals, the storing means communicating with the controller;

wherein, upon completion of the providing of the stimulus signals to the equipment, the controller can recall from the storing means a particular data representing the operational status of the equipment for a corresponding stimulus and expected signal comparison.

2. Apparatus according to claim 1, further comprising:

means connected to the fetching and providing means and the receiving means for activating independently on a real time basis the driving means and the receiving means, thereby preventing simultaneous operation of the driving means and the receiving means.

3. Apparatus according to claim 2, further comprising:

control logic means interfacing with the controller, the stimulating means, the expected memory means, the response data storing means and the independent activating means, the control logic means working cooperatively with a buffer means to provide overloading protection for the testing instrument.

4. Apparatus according to claim 3 wherein the buffer means provides bi-directional communication between the controller and the expected memory means, the response memory means, the stimulating means and the independent activating means.

5. Apparatus according to claim 1 further comprising:

means connected to the fetching and providing means and the receiving means for establishing reference levels for the receiving means to acknowledge the receipt of response signals from the equipment.

6. Apparatus according to claim 1, further comprising:

means communicating with the controller for providing timing to and for logically controlling the comparing means, the driving means and the receiving means.

7. An apparatus for testing the operational status of an equipment under test, comprising:

processor means for generating stimulus patterns;

first means connected to the processor means for storing the stimulus patterns;

means connected to the first storing means and the equipment, for fetching the stored stimulus patterns from the first storing means and for providing the stimulus patterns to the equipment, respectively, thereby causing the equipment to generate response patterns in reaction to the stimulus patterns;

means connected to the equipment and working cooperatively with the fetching and providing means for receiving the response patterns generated by the equipment;

means connected to the receiving means for comparing in real time the response patterns inputted thereto by the receiving means with pre-determined expected patterns fed therein from an expected storage means;

means connected to the comparing means for indicating the operational status of the equipment, the comparing means sending out an error status signal to the indicating means for identifying an improper operation by the equipment when a response pattern differs from an expected pattern;

means having an input connected to an output of the comparing means for storing therein data resulting from the comparing of the response patterns and the expected patterns;

wherein, upon completion of the equipment testing, a particular result data representing the operational status of the equipment for a specific response and expected pattern comparison can be recalled.

8. Apparatus according to claim 7, further comprising:

means connected to the fetching and providing means and the receiving means for activating these means independently on a real time basis to prevent therefrom simultaneous operations.

9. Apparatus according to claim 8, further comprising:

means communicating with the comparing means, the first storing means and the independent activating means for logically controlling the comparing means, the fetching and providing means and the receiving means.

10. Apparatus according claim 9, further comprising:

means connected to the fetching and providing means and the receiving means for establishing reference levels for the receiving means to acknowledge the receipt of response patterns from the equipment.

11. Apparatus according to claim 10, further comprising:

control logic means interfacing with the first storing means, the expected storage means, the resulting data storing means and the independent activating means, the control logic means working cooperatively with a buffer means to provide overloading protection for the apparatus.

* * * * *

UNITED STATES PATENT AND TRADEMARK OFFICE
CERTIFICATE OF CORRECTION

PATENT NO. : 4,799,220
DATED : January 17, 1989
INVENTOR(S) : Robert E. Nielsen

It is certified that error appears in the above-identified patent and that said Letters Patent is hereby corrected as shown below:

Column 5, line 40, before "only" insert --it is--.

Column 5, line 41, change "now" to --how--.

Column 5, line 65, change "Of" to --of--.

Signed and Sealed this

Eighteenth Day of July, 1989

Attest:

DONALD J. QUIGG

Attesting Officer

Commissioner of Patents and Trademarks